US005608737A

United States Patent [19]
Kimura et al.

[11] Patent Number: 5,608,737
[45] Date of Patent: Mar. 4, 1997

[54] MAXIMUM LIKELIHOOD DECODER AND DECODING METHOD

[75] Inventors: Tomohiro Kimura, Kawachinagano; Yasuo Harada, Kobe; Kazuhiro Ohta, Osaka, all of Japan

[73] Assignee: Matsushita Electric Industrial Co., Ltd., Osaka, Japan

[21] Appl. No.: 391,002

[22] Filed: Feb. 21, 1995

[30] Foreign Application Priority Data

Feb. 18, 1994 [JP] Japan .................................. 6-021036

[51] Int. Cl.$^6$ ................................................ H03M 13/12
[52] U.S. Cl. ............................ 371/30; 341/107; 371/43
[58] Field of Search .................. 371/30, 43; 375/262; 341/107

[56] References Cited

U.S. PATENT DOCUMENTS 5,479,419  12/1995  Naoi et al. ................................ 371/43

FOREIGN PATENT DOCUMENTS

430428   6/1991  European Pat. Off. .
5-130079 5/1993  Japan .

Primary Examiner—Stephen M. Baker
Attorney, Agent, or Firm—Wenderoth, Lind & Ponack

[57] ABSTRACT

A signal vector sequence corresponding to one block which is inputted in continuous n symbol sections is held in a vector sequence holding portion 11. A virtual information generating portion 12 and a coding portion 13 successively generate, with respect to N paths which can exist in the one block, corresponding virtual code vector sequences. A metric calculating portion 14 receives the signal vector sequence held in the vector sequence holding portion 11 and each of the virtual code vector sequences applied from the coding portion 13 to calculate respective metrics of the N paths. A metric comparing portion 16 and a metric holding portion 15 judge a maximum likelihood path having the minimum metric on the basis of the respective metrics calculated by the metric operating portion 14. When processing of the N paths is terminated, an information holding portion 17 acquires from the virtual information generating portion 12 as it existed before the coding on the virtual code vector sequence corresponding to the maximum likelihood path and outputs the information as the result of the decoding. In calculating the respective metrics of the N paths which can exist in one block, the metric calculating portion 14 finds a metric value in a state where the terms of the square of the magnitude of a signal vector are previously subtracted from each of calculation expressions. Consequently, the calculation processing is simplified, and the circuit arrangement is simplified.

7 Claims, 5 Drawing Sheets

MAXIMUM LIKELIHOOD DECODER AND DECODING METHOD

BACKGROUND OF THE INVENTION

1. Field of the Invention

The present invention relates generally to a maximum likelihood decoder and a maximum likelihood decoding method, and more particularly, to a device for and a method of maximum-likelihood-decoding a signal vector sequence control-coded to acquire information as it existed before the coding on the signal vector sequence by which noises are reduced.

2. Description of the Background Art

In recent years, digital communication and digital recording and reproduction have been advanced so as to achieve high-quality communication and high-quality recording and reproduction. Maximum likelihood decoding is a decoding method aiming at reducing noises from a digital signal received or reproduced to obtain error-free data in the case of such digital communication and digital recording and reproduction. Consequently, a maximum likelihood detector has been frequently used for an error correcting device, a trellis decoder or the like in a digital communication equipment and a digital recording and reproducing equipment.

Figure 5:
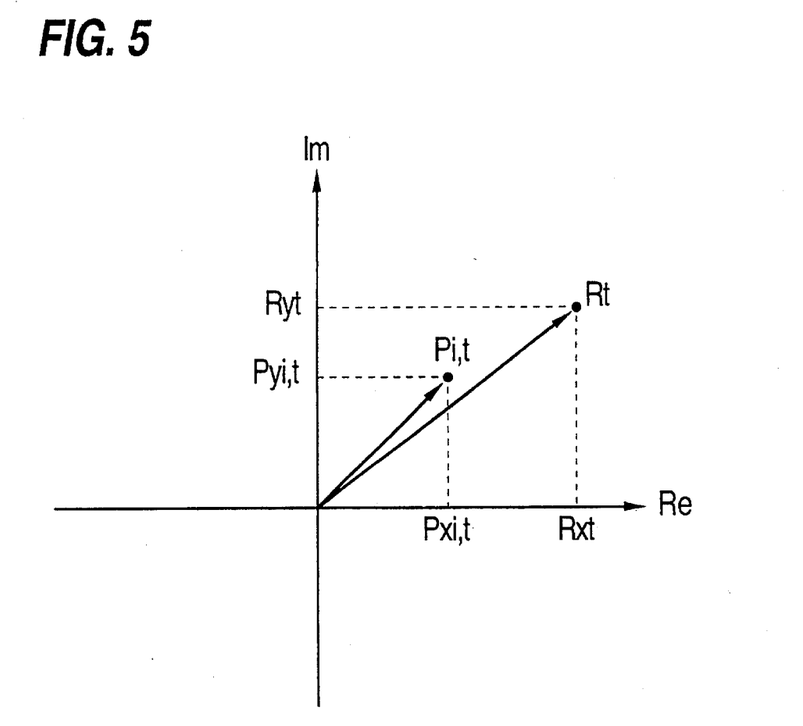
FIG. 5 is a diagram showing a signal vector $R_t$ received or reproduced and a corresponding virtual code vector $P_{i,t}$ in an i-th virtual code vector sequence.

FIG. 5 shows a signal vector $R_t$ in a symbol period t and a corresponding code vector $P_{i,t}$ in an i-th virtual code vector string. In a conventional maximum likelihood decoding method, a metric $\Gamma i$ of the i-th virtual code vector sequence is calculated using the following equation (1) as the square of the magnitude of an error vector, and metrics $\Gamma i$ of virtual code vector sequences corresponding to all paths are found, to obtain information for generating the virtual code vector sequence having the minimum metric $\Gamma i$ as the result of the decoding:

$$\Gamma i = \sum_{t=1}^{n} |R_t - P_{i,t}|^2 \quad (1)$$

When the signal vector $R_t$ and the code vector $P_{i,t}$ are respectively represented as complex numbers by the following equations (2) and (3):

$$R_t = R_{xt} + jR_{yt} \quad (2)$$

$$P_{i,t} = P_{xi,t} + jP_{yi,t} \quad (3)$$

the metric $\Gamma i$ of the i-th virtual code vector sequence can be also calculated in accordance with the following equation (4):

$$\Gamma i = \sum_{t=1}^{n} \{(R_{xt} - P_{xi,t})^2 + (R_{yt} - P_{yi,t})^2\} \quad (4)$$

In the foregoing equation, t meets the condition of $1 \leq t \leq n$.

In the above described conventional maximum likelihood decoding method, however, a square operation must be performed in finding the metric $\Gamma i$ of the i-th virtual code vector sequence, whereby the scale of an operating circuit becomes large and processing time for the operation becomes long.

Therefore, an object of the present invention is to provide a maximum likelihood decoder having a simple circuit arrangement and capable of performing a high-speed operation and a maximum likelihood decoding method.

SUMMARY OF THE INVENTION

In accordance with a first aspect, the present invention is directed to a device for or a method of maximum-likelihood-decoding a signal vector sequence control-coded for each block having as one unit n (n is an integer of not less than 2) continuous symbol sections to acquire information as it existed before the coding on the signal vector sequence by which noises are reduced. In the first aspect, the signal vector sequence corresponding to the one block and virtual code vector sequences respectively corresponding to N paths which can exist in the one block are sequentially inputted, to calculate respective metrics of the N paths. A maximum likelihood path having the minimum metric is judged on the basis of the calculate metrics. Further, with respect to the virtual code vector sequence corresponding to the judged maximum likelihood path, information before the coding on the virtual code vector sequence is outputted as the result of the decoding.

In the first aspect of the present invention, when the signal vector sequence is represented by $[R_1, R_2, \ldots, R_t, \ldots, R_n]$, the i-th (i is an integer of not less than 1 nor more than N) virtual code vector sequence is represented by $[P_{i,1}, P_{i,2}, \ldots, P_{i,t}, \ldots, P_{i,n}]$, and the signal vector $R_t$ and the virtual code vector $P_{i,t}$ in the t-th (where $1 \leq t \leq n$) symbol section are respectively represented as complex numbers by the following equations:

$$R_t = R_{xt} + jR_{yt},$$

and $$P_{i,t} = P_{xi,t} + jP_{yi,t},$$

a metric $\Gamma i$ of the i-th virtual code vector sequence is calculated in accordance with the following equation:

$$\Gamma i = \sum_{t=1}^{n} \{(P_{xi,t} - 2R_{xt})P_{xi,t} + (P_{yi,t} - 2R_{yt})P_{yi,t}\}$$

As described in the foregoing, in the first aspect, in calculating respective metrics of N paths which can exist in one block, a metric value in a state where the terms of the square of the magnitude of a signal vector are previously subtracted from each of calculation expressions. Consequently, calculation processing is simplified. Therefore, it is possible to realize a maximum likelihood decoder having a simple circuit arrangement and capable of performing a high-speed operation or a maximum likelihood decoding method.

Furthermore, in accordance with the first aspect of the present invention, the maximum likelihood decoder comprises vector sequence holding means for temporarily holding the signal vector sequence inputted in at least the n symbol sections, virtual code vector sequence generating means for successively generating, with respect to N paths which can exist in the n symbol sections, corresponding virtual code vector sequences, metric calculating means for inputting the signal vector sequence held in the vector sequence holding means and each of the virtual code vector sequences generated by the virtual code vector sequence generating means and calculating respective metrics of the N paths, maximum likelihood path judging means for judging a maximum likelihood path having the minimum metric on the basis of the metrics operated by the metric operating means, and decoding result outputting means for outputting, with respect to the virtual code vector sequence corresponding to the maximum likelihood path, information as it existed before the coding on the virtual code vector sequence as the result of the decoding.

The above described metric operating means can be constituted by an adder and a bit shifter.

In accordance with a second aspect, the present invention is directed to a device for or a method of dynamically maximum-likelihood-decoding a signal vector sequence control-coded for each symbol to acquire information as it existed before the coding on the signal vector sequence by which noises are reduced. In the second aspect, the signal vector sequence is inputted for each symbol, to find a plurality of branch metrics γj (j is an integer of not less than 1 nor more than k) with respect to a group of virtual code vectors including a plurality of virtual code vectors. The found branch metrics γj are subjected to decoding processing using a viterbi algorithm, thereby to obtain a decoding output.

In accordance with the second aspect of the present invention, when the signal vector sequence is represented as a complex number $(R_x, R_y)$, and the group of virtual code vectors is represented as a complex number $\{(P_{xj}, P_{yj})\}_{j=1-k}$, the branch metrics γj are calculated in accordance with the following equation:

$$\gamma j = (P_{xj} - 2R_x)P_{xj} + (P_{yj} - 2R_y)P_{yj}$$

As described in the foregoing, in the second aspect, in calculating branch metrics γj for each symbol, a branch metric value is obtained in a state where the terms of the square of the magnitude of a signal vector are subtracted from each of calculation expressions. Consequently, calculation processing is simplified. Therefore, it is possible to realize a maximum likelihood decoder having a simple circuit arrangement and capable of performing a high-speed operation or a maximum likelihood decoding method.

Furthermore, in accordance with the second aspect of the present invention, the maximum likelihood decoder comprises branch metric calculating means for inputting the signal vector sequence for each symbol and finding the plurality of branch metrics γj with respect to a group of virtual code vectors including a plurality of virtual code vectors, and viterbi decoding means for inputting the branch metrics γj and performing decoding processing using a viterbi algorithm.

The above described viterbi decoding means may comprise adding means for inputting the branch metrics γj and a plurality of path metric ⌈p (p is an integer of not less than 1 nor more than m) and adding the branch metrics γj and the path metrics ⌈p in predetermined combinations to output the plurality of path metrics, comparing and selecting means for comparing the path metrics outputted from the adding means in predetermined combinations, selecting the minimum path metric ⌈p in each of the combinations to output the selected minimum path metric, and outputting path selection information indicating which of the path metrics is selected, path metric holding means for holding the path metric ⌈p outputted from the comparing and selecting means and supplying the held path metric to the adding means, a path memory storing the path selection information outputted from the comparing and selecting means, and trace back means for tracing back the path selection information stored in the path memory to output the path selection information traced back as decoding information in accordance with the path metric held in the path metric holding means.

Furthermore, the branch metric calculating means may be constituted by an adder and a bit shifter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
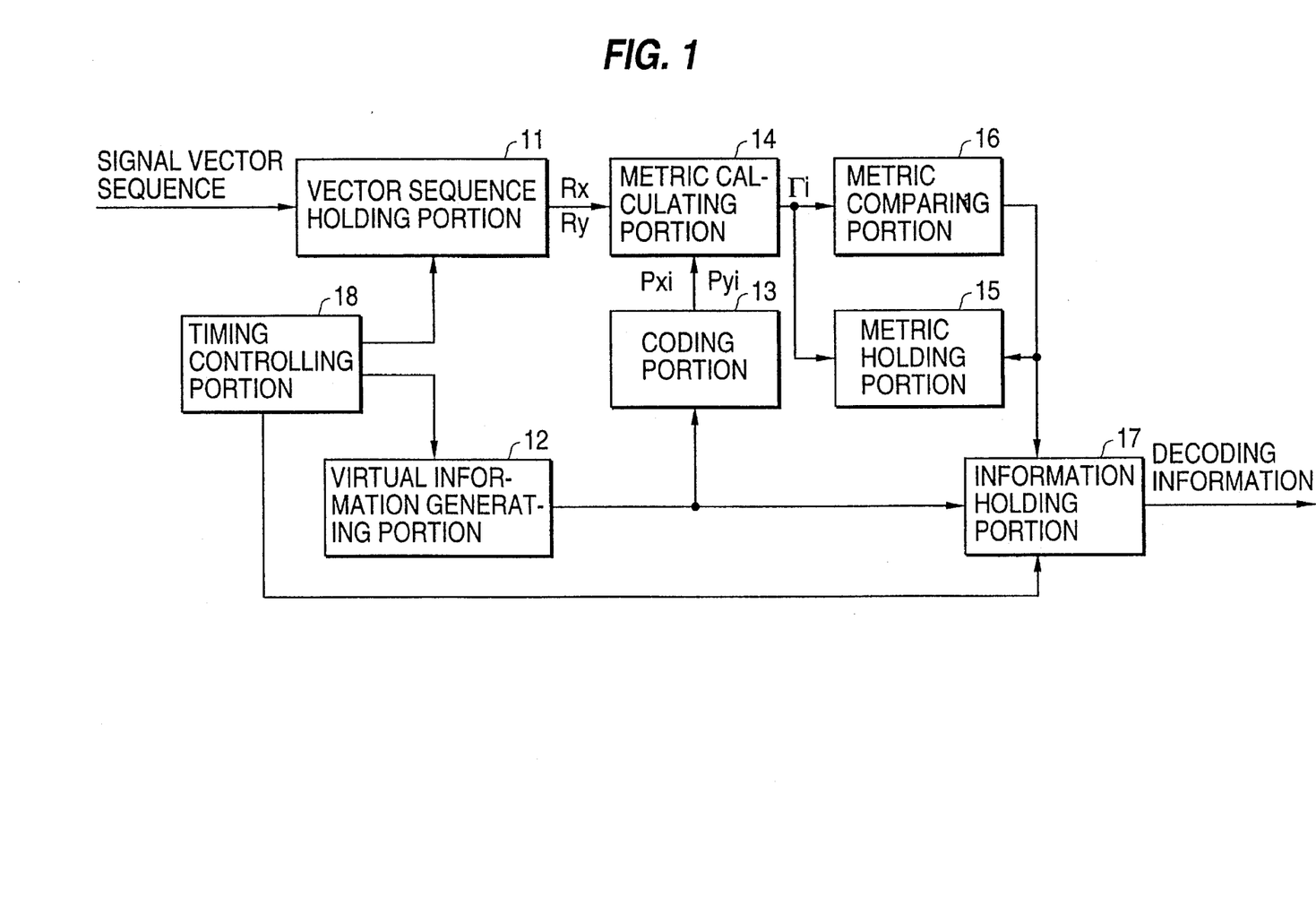
FIG. 1 is a block diagram showing the construction of a maximum likelihood decoder according to a first embodiment.

FIG. 1 is a block diagram showing the construction of a maximum likelihood decoder according to a first embodiment of the present invention. In FIG. 1, the maximum likelihood decoder comprises a vector sequence holding portion 11, a virtual information generating portion 12, a coding portion 13, a metric calculating portion 14, a metric holding portion 15, a metric comparing portion 16, an information holding portion 17, and a timing control portion 18.

Description is now made of the entire operation of the maximum likelihood decoder according to the first embodiment. The maximum likelihood decoder according to the present embodiment uses as one unit block a signal vector sequence in n continuous symbol sections to perform maximum likelihood decoding for each block. If there are k types of values which one signal vector can take (which differ depending on the modulation method), the total number of virtual code vector sequences (that is, paths) which can exist in the n continuous symbol sections is $k^n = N$.

The vector sequence holding portion 11, to which a signal vector sequence $[R_1, R_2, \ldots, R_t, \ldots, R_n]$ received or reproduced in the n symbol sections is inputted, holds the signal vector sequence. The vector sequence holding portion 11 outputs the held signal vector sequence $[R_1, R_2, \ldots, R_t, \ldots, R_n]$ repeatedly N times in synchronism with a timing signal from the timing control portion 18.

The virtual information holding portion 12 generates i-th virtual information when the signal vector sequence $[R_1, R_2, \ldots, R_t, \ldots, R_n]$ is outputted the i-th (i is a natural number of not more than N) time from the vector sequence holding portion 11. The coding portion 13 codes the i-th virtual information applied from the virtual information holding portion 12, to thereby generate an i-th virtual code vector sequence $[P_{i,1}, P_{i,2}, \ldots, P_{i,t}, \ldots, P_{i,n}]$. The metric calculating portion 14, to which the signal vector sequence outputted from the vector sequence holding portion 11 and the i-th virtual code vector sequence generated by the coding portion 13 are inputted, performs a predetermined operation, to thereby find a metric ⌈i of the i-th virtual code vector sequence.

The metric holding portion 15 holds a minimum metric ⌈min. The metric comparing portion 16 compares the metric ⌈i found by the metric calculating portion 14 with the minimum metric ⌈min held in the metric holding portion 15 and outputs an update signal if the metric ⌈i is less than the minimum metric ⌈min. The metric holding portion 15 holds the metric ⌈i found by the metric operating portion 14 as a new minimum metric ⌈min in response to the update signal. Consequently, the minimum metric out of the metrics so far calculated is always held in the metric holding portion 15.

The information holding portion 17 holds the virtual information i outputted from the virtual information holding portion 12 as maximum likelihood information so far obtained if the update signal is outputted from the metric comparing portion 16. If processing with respect to all the first to N-th virtual information is terminated, a termination signal is outputted from the timing control portion 18. The information holding portion 17 outputs the maximum likelihood information held therein as decoding information in response to the termination signal.

In the above described first embodiment, the metric calculating portion 14 performs an operation according to the following equation (5), to thereby find the metric ⌈i of the virtual code vector sequence.

$$\Gamma i = \sum_{t=1}^{n} \{(R_{xt} - P_{xi,t})^2 - R_{xt}^2 + (R_{yt} - P_{yi,t})^2 - R_{yt}^2\} \quad (5)$$

$$= \sum_{t=1}^{n} \{(P_{xi,t} - 2R_{xt})P_{xi,t} + (P_{yi,t} - 2R_{yt})P_{yi,t}\}$$

As described in the foregoing, in the conventional maximum likelihood decoding method, the metric ⌈i of the i-th virtual code vector sequence is applied as the square of the magnitude of an error vector and is calculated using the foregoing equation (4).

In order to obtain the virtual code vector sequence having the minimum metric, however, it may be judged which of the metrics of at least two arbitrary virtual code vector sequences is larger. In order to only attain this object, the metric ⌈i of the i-th virtual code vector sequence may be calculated using the foregoing equation (5). The metric ⌈i of the i-th virtual code vector sequence calculated using the equation (5) is one obtained by subtracting $(R_{xt}^2 + R_{yt}^2)$ from the metric ⌈i calculated using the equation (4). $(R_{xt}^2 + R_{yt}^2)$ always appears as the same value even when the metric of any virtual code vector sequence is calculated. In calculating the respective metrics of the virtual code vector sequences, therefore, $(R_{xt}^2 + R_{yt}^2)$ may be uniformly subtracted from the metric ⌈i calculated using the equation (4), which does not affect the judgment of the large-or-small relationship between the metrics. The reason for this is that the large-or-small relationship between the metrics ⌈i is caused by only the difference between the virtual code vector sequences. Consequently, the large-or-small relationship judged from the metric ⌈i calculated using the equation (5) and the large-or-small relationship judged from the metric ⌈i calculated using the equation (4) become the same result.

Since in the foregoing equation (5), $P_{xi,t}$ and $P_{yi,t}$ are some particular values determined by the modulation method, the calculation using the equation (5) in the metric calculating portion 14 becomes very simple. For example, if the modulation method is 16-ary quadrature amplitude modulation (16QAM), the metric calculating portion 14 can be realized by a circuit arrangement as shown in FIG. 2.

Figure 2:
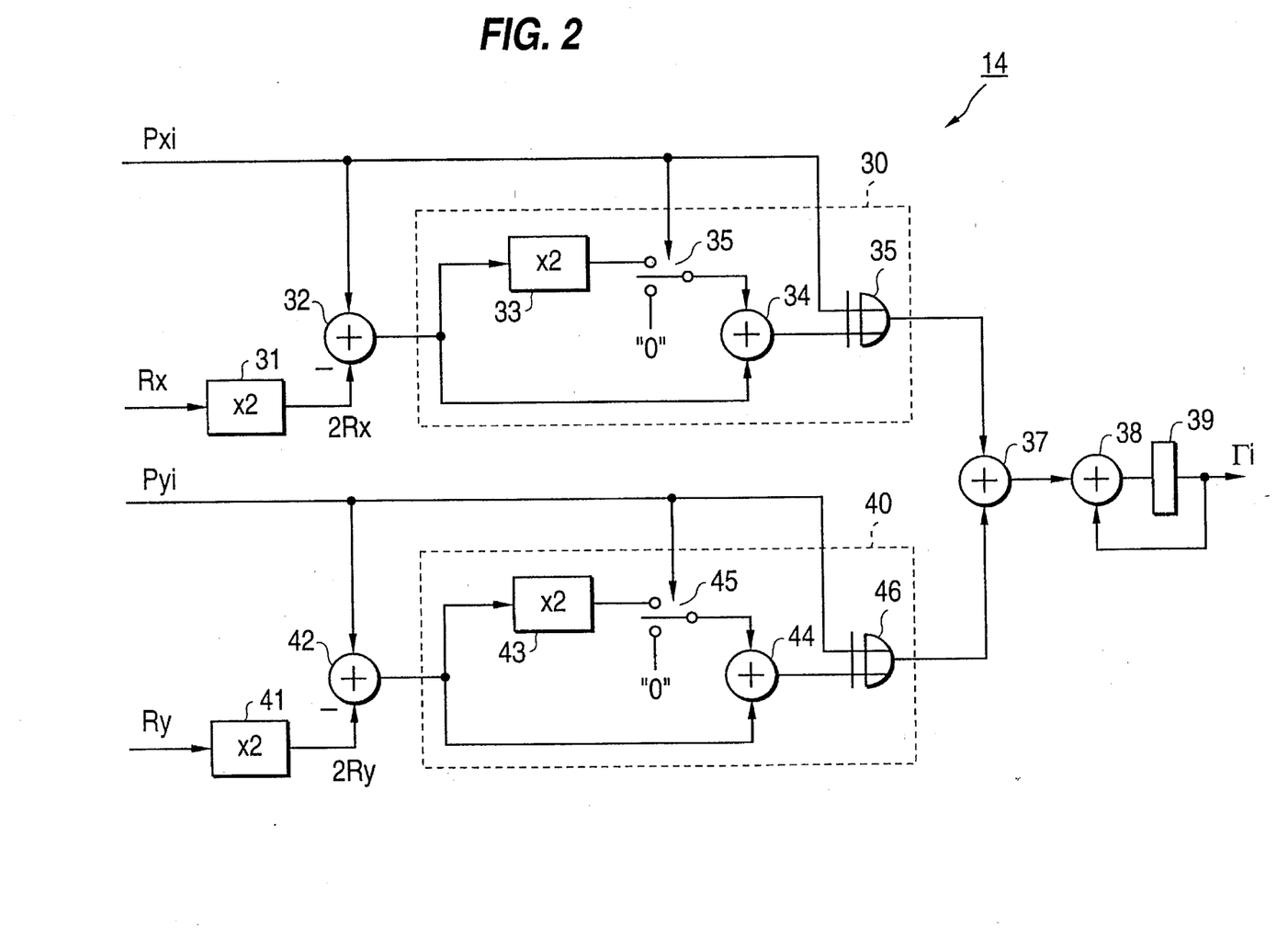
FIG. 2 is a circuit diagram showing the more detailed construction of a metric operating portion in the first embodiment.

In FIG. 2, the metric calculating portion 14 comprises a doubling portion 31, a subtracting portion 32, a doubling portion 33, an adding portion 34, a switching portion 35, a sign reversing portion 36, an adding portion 37, an adding portion 38, a holding portion 39, a doubling portion 41, a subtracting portion 42, a doubling portion 43, a switching portion 45, an adding portion 44, and a sign reversing portion 46.

Figure 6:
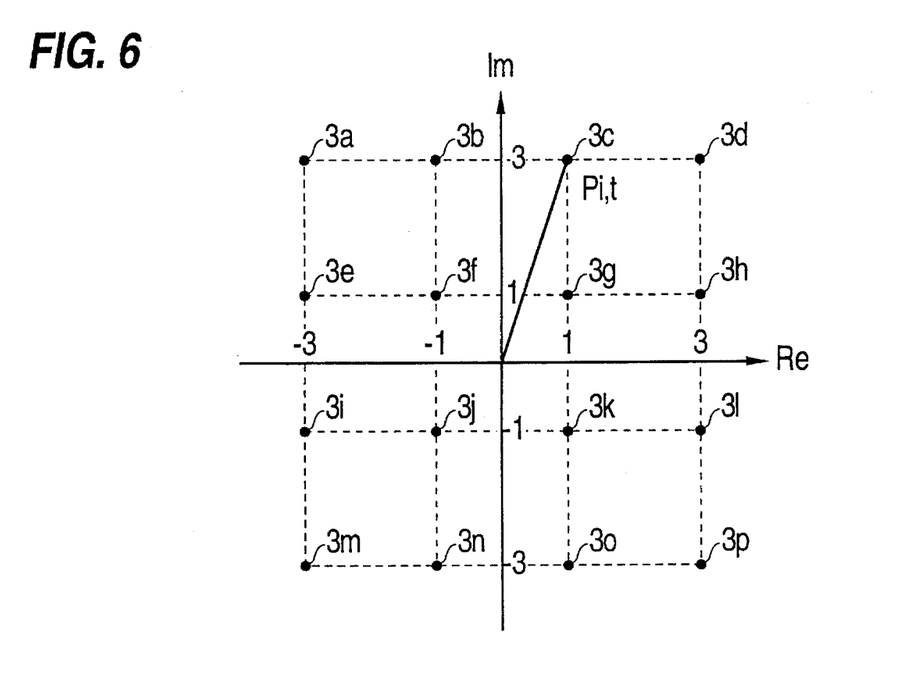
FIG. 6 is a diagram showing the arrangement of signal points in 16-ary quadrature amplitude modulation.

FIG. 6 illustrates the arrangement of signal points in the 16QAM. In the 16QAM, a virtual code vector $P_{i,t}$ corresponds to any one of signal points 3a to 3p. Consequently, a component $P_{xi,t}$ in the direction of the X-axis and a component $P_{yi,t}$ in the direction of the Y-axis of the virtual code vector $P_{i,t}$ take any one of ±1 and ±3.

Referring now to FIG. 6, description is made of operations performed by the metric operating portion 14 shown in FIG. 2. A signal vector sequence and a virtual code vector sequence are sequentially supplied respectively as a first input $(R_x, R_y)$ and a second input $(P_{xi}, P_{yi})$ to the metric operating portion 14.

The doubling portion 31 doubles $R_x$ to output $2R_x$. The subtracting portion 32 subtracts $2R_x$ from $P_{xi}$. Consequently, a value $(P_{xi} - 2R_x)$ is outputted from the subtracting portion 32. The doubling portion 33 doubles the value $(P_{xi} - 2R_x)$ outputted from the subtracting portion 32 to output the doubled value. The output of the subtracting portion 32 and an output of the switching portion 35 are respectively supplied to one input and the other input of the adding portion 34. The switching portion 35 supplies the output of the doubling portion 33 to the adding portion 34 if the value of $P_{xi}$ is +3 or −3. At this time, a value $(P_{xi} - 2R_x) \times 3$ which is three times the output value of the adding portion 32 is outputted from the adding portion 34. In addition, the switching portion 35 supplies a value 0 to the adding portion 33 if the value of $P_{xi}$ is +1 or −1. At this time, the output value $(P_{xi} - 2R_x)$ of the subtracting portion 32 is directly outputted from the adding portion 34. The sign reversing portion 36 is constituted by an exclusive OR and the like, and converts the sign of the value outputted from the adding portion 34 if the value of $P_{xi}$ is negative. By the above described series of operations, $(P_{xi} - 2R_x)P_{xi}$ is obtained from the sign reversing portion 36.

Similarly, the doubling portion 41 doubles $R_y$ to output $2R_y$. The subtracting portion 42 subtracts $2R_y$ from $P_{yi}$. Consequently, a value $(P_{yi} - 2R_y)$ is outputted from the subtracting portion 42. The doubling portion 43 doubles the value $(P_{yi} - 2R_y)$ outputted from the subtracting portion 42 to output the doubled value. The output of the subtracting portion 42 and an output of the switching portion 45 are respectively supplied to one input and the other input of the adding portion 44. The switching portion 45 supplies the output of the doubling portion 43 to the adding portion 44 if the value of $P_{yi}$ is +3 or −3. At this time, a value $(P_{yi} - 2R_y) \times 3$ which is three times the output value of the adding portion 42 is outputted from the adding portion 44. In addition, the switching portion 45 supplies a value 0 to the adding portion 44 if the value of $P_{yi}$ is +1 or −1. At this time, the output value $(P_{yi} - 2R_y)$ of the subtracting portion 42 is directly outputted from the adding portion 44. The sign reversing portion 46 is constituted by an exclusive OR and the like, and converts the sign of the value outputted from the adding portion 44 if the value of $P_{yi}$ is negative. By the above described series of operations, $(P_{yi} - 2R_y)P_{yi}$ is obtained from the sign reversing portion 46.

The doubling portions 31, 33, 41 and 43 can be simply realized by 1-bit shifters.

The adding portion 37 adds the output value of the sign reversing portion 36 and the output value of the sign reversing portion 46, to output $(P_{xi} - 2R_x)P_{xi} + (P_{yi} - 2R_y)P_{yi}$. The holding portion 39 temporarily holds a metric in an accumulation operation which is outputted from the adding portion 38. The adding portion 38 adds the output value of the adding portion 37 and an output value of the holding portion 39, to output the result of the addition to the holding portion 39. The output value of the adding portion 37 is accumulated by the adding portion 38 and the holding portion 39. As a result, a metric $\lceil i$ according to the equation (5) is obtained from the holding portion 39.

As described in the foregoing, in the first embodiment, the metric $\lceil i$ of the i-th virtual code vector sequence is operated using the equation (5). In the first embodiment, metrics according to the equation (5) are found with respect to all the virtual code vector sequences, and the virtual code vector sequence having the minimum metric is obtained out of all the virtual code vector sequences, thereby to perform maximum likelihood decoding. In the first embodiment, therefore, the metric operating portion 14 can be constituted by an adder and a simple logical circuit, thereby to make it possible to obtain a maximum likelihood decoder having a small-scale circuit arrangement and having a high processing speed.

In the above described first embodiment, the metric $\lceil i$ may be calculated using an equation obtained by adding a constant to the equation (5). Alternatively, the metric $\lceil i$ may be calculated using an equation obtained by multiplying the equation (5) by a constant. If the equation (5) is multiplied by a negative constant, however, a path having the maximum metric becomes a maximum likelihood path.

(2) Second Embodiment

Description is now made of a maximum likelihood decoder according to a second embodiment of the present invention. The maximum likelihood decoder according to the second embodiment uses a viterbi decoding algorithm as a maximum likelihood decoding algorithm. The basic viterbi decoding algorithm is described in detail in an article entitled by "Convolutional Codes and Their Performance in Communications Technology", October 1971, p.751–772. Briefly stated, the viterbi decoding algorithm is characterized by simultaneously retrieving a plurality of paths corresponding to virtual code strings and effectively terminating the retrieval of the virtual code string having a large metric to obtain the same result as that obtained by searching for a small number of paths to search for paths corresponding to all the virtual code strings.

Figure 3:
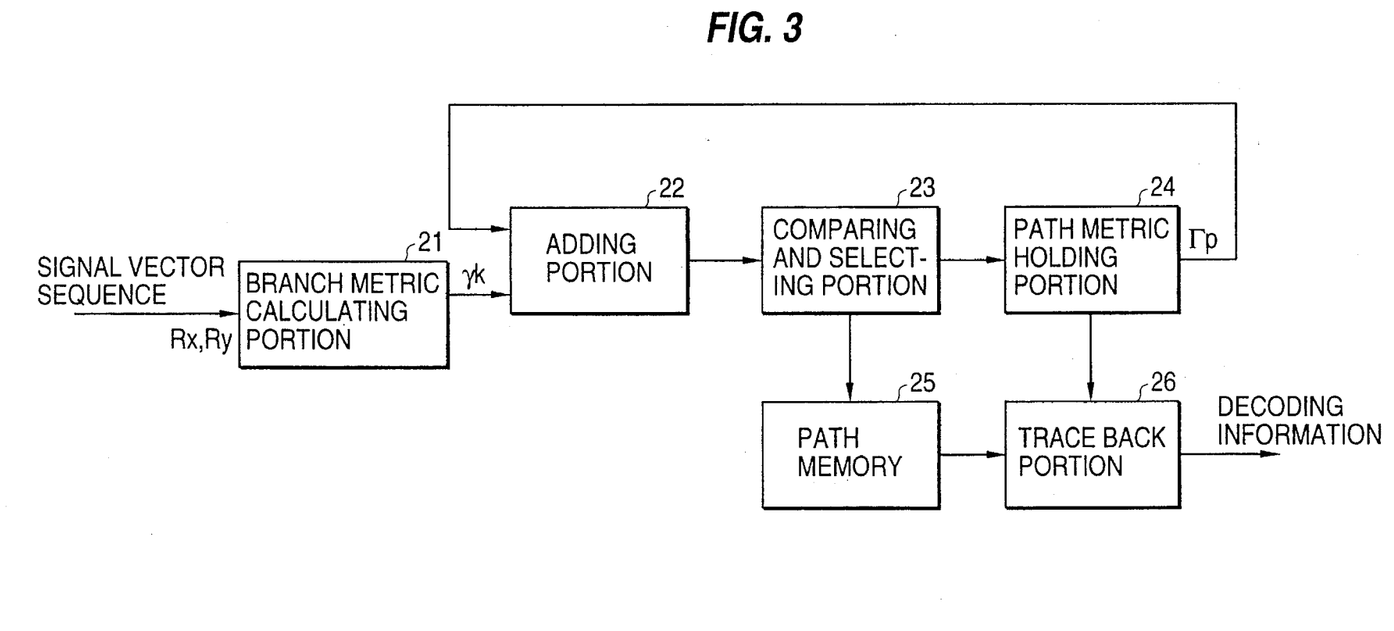
FIG. 3 is a block diagram showing the construction of a maximum likelihood decoder according to a second embodiment.

FIG. 3 is a block diagram showing the construction of a maximum likelihood decoder according to a second embodiment of the present invention using a viterbi decoding algorithm. In FIG. 3, the maximum likelihood decoder according to the second embodiment comprises a branch metric operating portion 21, an adding portion 22, a comparing and selecting portion 23, a path metric holding portion 24, a path memory 25, and a trace back portion 26.

Description is now made of the entire operation of the maximum likelihood decoder according to the second embodiment. A signal vector $(R_x, R_y)$ received or reproduced is successively inputted for each symbol to the branch metric operating portion 21. A group of virtual code vectors $\{(P_{xj}, P_{yj})\}_{j=1-k}$ including k (k is a value which one signal vector can take and differs depending on the modulation method) virtual code vectors is inputted for each symbol to the branch metric operating portion 21. The branch metric operating portion 21 operates a branch metric $\gamma j$ (j is an integer of not less than 1 nor more than k) on a trellis diagram in viterbi decoding on the basis of the inputted signal vector $(R_x, R_y)$.

The adding portion 22 adds m (m is the number of paths determined by the trellis diagram) path metrics $\lceil p$ (p is an integer of not less than 1 nor more than m) in the preceding symbol which are held in the path metric holding portion 24 and the branch metric $\gamma j$ calculated by the branch metric operating portion 21 in a predetermined combination determined by the rule for coding and outputs the result of the addition. The comparing and selecting portion 23 compares the path metrics outputted from the adding portion 22 in a plurality of predetermined combinations determined by the rule for coding to output the minimum path metric in each of the combinations and output path selection information indicating which of the path metrics is selected in each of the combinations. Consequently, the number of paths to be searched for is decreased. The path metric holding portion 24 holds the path metric outputted from the comparing and selecting portion 23 and supplies the held path metric to the adding portion 22 as a path metric $\lceil p$ in the succeeding symbol.

The path memory 25 stores the path selection information outputted from the comparing and selecting portion 23. The trace back portion 26 traces back a path having the minimum path metric out of the path metrics $\lceil p$ obtained by the path metric holding portion 24 from the path selection information stored in the path memory 25 and outputs the path as decoding information.

As described in the foregoing, in the second embodiment, it is possible to dynamically find the metrics $\lceil p$ of the paths corresponding to the plurality of virtual code vector sequences in the path metric holding portion 24 while inputting a signal vector for each symbol. In addition, in the second embodiment, the comparing and selecting portion 23 compares and selects the path metrics in the process of searching for a path, thereby to realize a viterbi decoding algorithm. Further, in the second embodiment, the path selection information stored in the path memory 25 is traced back by the trace back portion 26, thereby to make it possible to obtain the path corresponding to the virtual code vector sequence having the minimum metric.

In the maximum likelihood decoder according to the second embodiment, the metric of the virtual code vector sequence is found by performing an operation according to the following equation (6) in the branch metric calculating portion 21:

$$\gamma j = (R_x - R_{xj})^2 - R_x^2 + (R_y - R_{yj})^2 - R_y^2 \quad (6)$$
$$= (P_{xj} - 2R_x)P_{xj} + (P_{yj} - 2R_y)P_{yj}$$

Conventionally, the branch metric $\gamma j$ has been given as the square of the magnitude of an error vector and calculated using the following equation (7):

$$\gamma j = (R_x - P_{xj})^2 + (R_y - P_{yj})^2 \quad (7)$$

In order to obtain the virtual code vector sequence having the minimum metric, however, it may be judged which of the metrics of at least two arbitrary virtual code vector sequences is larger. In order to only attain this object, the branch metric $\gamma j$ may be calculated using the foregoing equation (6). The branch metric $\gamma j$ calculated using the equation (6) is one obtained by subtracting $(R_x+R_y^2)$ from the branch metric $\gamma j$ calculated using the equation (7). $(R_x^2+R_y^2)$ always appears as the same value even when the branch metric of any virtual code vector sequence is calculated. In calculating the branch metric of each of the virtual code vector sequences, therefore, $(R_x^2+R_y^2)$ may be uniformly subtracted from the branch metric $\gamma j$ calculated using the equation (7), which does not affect the judgment of the large-or-small relationship between the metrics. The reason for this is that the large-or-small relationship between the metrics is caused by only the difference between the virtual code vector sequences. Consequently, the large-or-small relationship judged from the metric calculated using the equation (6) and the large-or-small relationship judged from the metric calculated using the equation (7) become the same result.

Since in the foregoing equation (6), $P_{xj}$ and $P_{yj}$ are some particular values determined by the modulation method, the calculation using the equation (6) in the branch metric operating portion 21 becomes very simple. For example, if the modulation method is 16-ary quadrature amplitude modulation (16QAM), $P_{xj}$ and $P_{yj}$ take any one of the values ±1 and ±3 (see FIG. 6). The branch metric operating portion 21 can be realized by a circuit arrangement as shown in FIG. 4.

Figure 4:
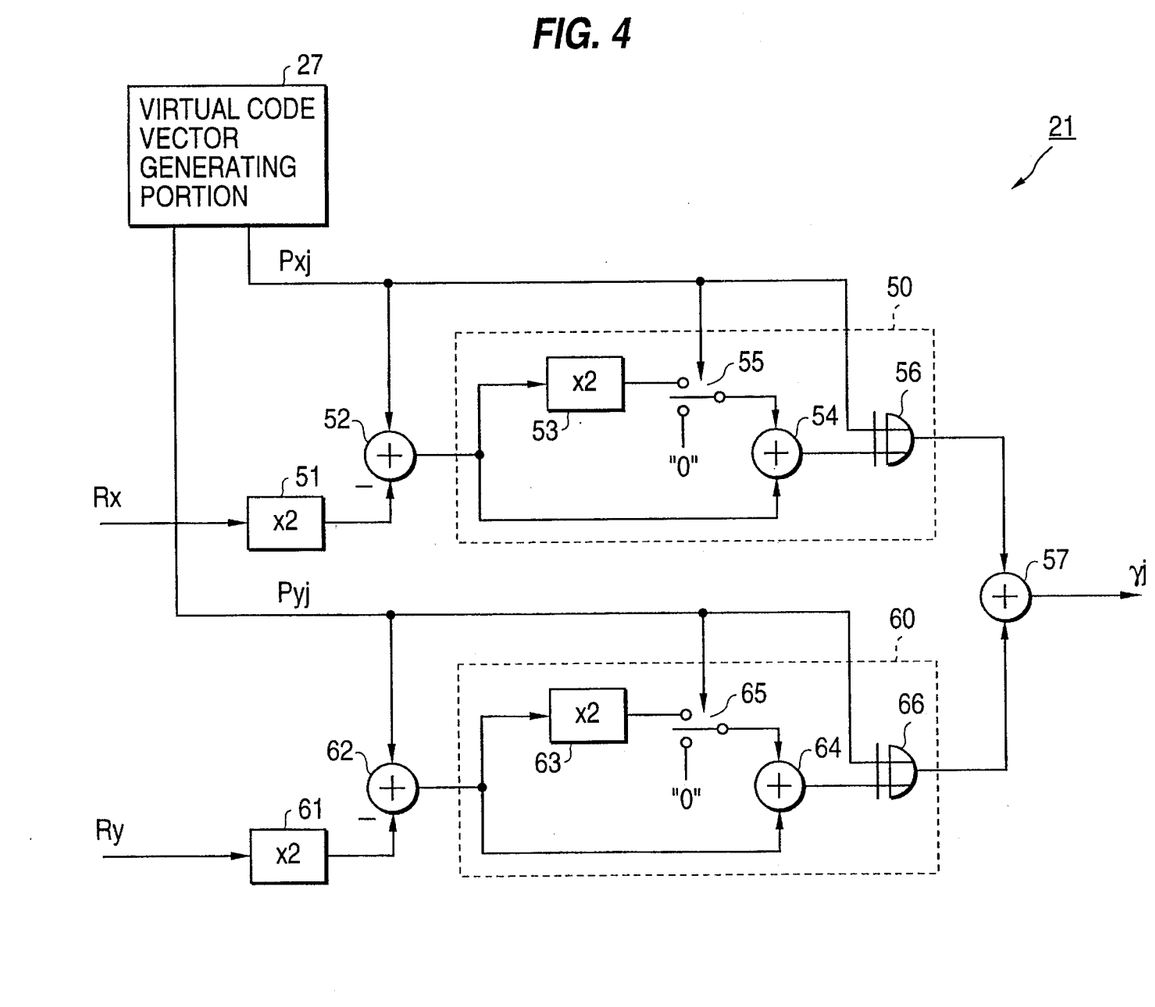
FIG. 4 is a circuit diagram showing the more detailed construction of a branch metric operating portion in the second embodiment.

In FIG. 4, the branch metric operating portion 21 comprises a virtual code vector generating portion 27, a doubling portion 51, a subtracting portion 52, a doubling portion 53, an adding portion 54, a switching portion 55, a sign reversing portion 56, an adding portion 57, a doubling portion 61, a subtracting portion 62, a doubling portion 63, a switching portion 65, an adding portion 64, and a sign reversing portion 66.

Description is now made of operations performed by the branch metric calculating portion 21 shown in FIG. 4. As described above, a signal vector ($R_x$, $R_y$) received or reproduced is successively inputted for each symbol to the branch metric calculated portion 21. In addition, a group of virtual code vectors $\{(P_{xj}, P_{yj})\}_{j=1-k}$ including k virtual code vectors is generated repeatedly for each symbol from the virtual code vector generating portion 27. Description is now made of a case where a branch metric of a j-th virtual vector ($P_{xj}$, $P_{yj}$) out of the k virtual code vectors $\{(P_{xj}, P_{yj})\}_{j=1-k}$ generated in a certain symbol section.

The doubling portion 51 doubles $R_x$ to output $2R_x$. The subtracting portion 52 subtracts $2R_x$ from $P_{xj}$. Consequently, a value ($P_{xj}-2R_x$) is outputted from the subtracting portion 52. The doubling portion 53 doubles the value ($P_{xj}-2R_x$) outputted from the subtracting portion 52 to output the doubled value. The output of the subtracting portion 52 and an output of the switching portion 55 are supplied to one input and the other input of the adding portion 54. The switching portion 55 supplies the output of the doubling portion 53 to the adding portion 54 if the value of $P_{xj}$ is +3 or −3. Consequently, a value ($P_{xj}-2R_x$)×3 which is three times the output value of the adding portion 52 is outputted from the adding portion 54. In addition, the switching portion 55 supplies a value 0 to the adding portion 54 if the value of $P_{xj}$ is +1 or −1. Consequently, the output value ($P_{xj}-2R_x$) of the subtracting portion 52 is directly outputted from the adding portion 54. The sign reversing portion 56 is constituted by an exclusive OR and the like, and converts the sign of the value outputted from the adding portion 54 if the value of $P_{xj}$ is negative. By the above described operations, ($P_{xj}-2R_x$)$P_{xj}$ is outputted from the sign reversing portion 56.

Similarly, the doubling portion 61 doubles $R_y$ to output $2R_y$. The subtracting portion 62 subtracts $2R_y$ from $P_{yj}$. Consequently, a value ($P_{yj}-2R_y$) is outputted from the subtracting portion 62. The doubling portion 63 doubles the value ($P_{yj}-2R_y$) outputted from the subtracting portion 62 to output the doubled value. The output of the subtracting portion 62 and an output of the switching portion 65 are respectively supplied to one input and the other input of the adding portion 64. The switching portion 65 supplies the output of the doubling portion 63 to the adding portion 64 if the value of $P_{yj}$ is +3 or −3. Consequently, a value ($P_{yj}-2P_y$)×3 which is three times the output value of the adding portion 62 is outputted from the adding portion 64. In addition, the switching portion 65 supplies a value 0 to the adding portion 64 if the value of $P_{yj}$ is +1 or −1. Consequently, the output value ($P_{yj}-2R_y$) of the subtracting portion 62 is directly outputted from the adding portion 64. The sign reversing portion 66 is constituted by an exclusive OR and the like, and converts the sign of the value outputted from the adding portion 64 if the value of $P_{yj}$ is negative. By the above described operations, ($P_{yj}-2R_y$)$P_{yj}$ is outputted from the sign reversing portion 66.

The doubling portions 51, 53, 61 and 63 can be simply realized by 1-bit shifters. The adding portion 57 adds the output value of the sign reversing portion 56 and the output value of the sign reversing portion 66, to output ($P_{yj}-2R_x$)$P_{xj}+(P_{yj}-2R_y)P_{yj}$ as a branch metric γj.

As described in the foregoing, in the second embodiment, the branch metric γj is calculated using the equation (6). In the second embodiment, viterbi decoding is performed on the basis of the calculated branch metric γj, thereby to obtain the virtual code vector sequence having the minimum metric out of all the virtual code vector sequences. In the second embodiment, therefore, the branch metric calculating portion 21 can be constituted by an adder and a simple logical circuit, thereby to make it possible to obtain a maximum likelihood decoder having a small-scale circuit arrangement and having a slow processing speed.

In the above described second embodiment, the branch metric γj may be calculated using an equation obtained by adding a constant to the equation (6). Alternatively, the branch metric γj may be calculated using an equation obtained by multiplying the equation (6) by a constant. If the equation (6) is multiplied by a negative constant, however, a path having the maximum metric becomes a maximum likelihood path.

Furthermore, the branch metric calculating portion 21 may be one comprising k circuit blocks each including a doubling portion 51, a subtracting portion 52, a doubling portion 53, an adding portion 54, a switching portion 55, a sign reversing portion 56, an adding portion 57, a doubling portion 61, a subtracting portion 62, a doubling portion 63, an adding portion 64, a switching portion 65, and a sign reversing portion 66 and in which virtual code vectors ($P_{x1}$, $P_{y1}$), ..., ($P_{xj}$, $P_{yj}$), ..., ($P_{xk}$, $P_{yk}$) are fixedly applied to each of the circuit blocks to calculate and output respective branch metrics γ1, ..., γj, ..., γk.

In the case, the virtual code vector ($P_{xj}$, $P_{yj}$) is a fixed value. If $P_{xj}$ is +1 or −1, therefore, the doubling portion 53, the adding portion 54 and the switching portion 55 are not required. In addition, the sign reversing portion 56 is not required if $P_{xj}$ is positive, while the sign reversing portion 66 can be constituted by a NOT circuit if $P_{xj}$ is negative. If $P_{yj}$ is +1 or −1, the doubling portion 63, the adding portion 64 and the switching portion 55 are not required. In addition, the sign reversing portion 66 is not required if $P_{yj}$ is positive, while the sign reversing portion 66 can be constituted by a NOT circuit if $P_{yj}$ is negative.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A maximum likelihood decoder for maximum-likelihood-decoding a signal vector sequence control-coded for each block having as one unit n (n is an integer of not less than two) continuous symbol sections to acquire information as it existed before the coding on the signal vector sequence by which noises are reduced, comprising:

vector sequence holding means for temporarily holding said signal vector sequence inputted in at least said n symbol sections;

virtual code vector sequence generating means for successively generating, with respect to N paths which can exist in said n symbol sections, corresponding virtual code vector sequences;

metric calculating means for receiving the signal vector sequence held in said vector sequence holding means and each of the virtual code vector sequences generated by said virtual code vector sequence generating means and for calculating respective metrics of said N paths;

maximum likelihood path judging means for judging a maximum likelihood path having the minimum metric on the basis of the metrics calculated by said metric calculating means; and decoding result outputting means for outputting, with respect to the virtual code vector sequence corresponding to said maximum likelihood path, information as it existed before the coding on the virtual code vector sequence as the result of the decoding, wherein, assuming said signal vector sequence is represented by $\{R_1, R_2, \ldots, R_t, \ldots, R_n\}$, said i-th (i is an integer of not less than one nor more than N) virtual code vector sequence is represented by $\{P_{i,1}, P_{i,2}, \ldots, P_{i,t}, \ldots, P_{i,n}\}$, and the signal vector $R_t$ and the virtual code vector $P_{i,t}$ in the t-th (where $1 \leq t \leq n$) symbol section are respectively represented as complex numbers by the following equations:

$$R_t = R_{xt} + jR_{yt},$$

and $$P_{i,t} + P_{xi,t} + jP_{yi,t},$$

said metric calculating means calculating a metric $\lceil i$ of the i-th virtual code vector sequence in accordance with the following equation:

$$\Gamma i = \sum_{t=1}^{n} \{(P_{xi,t} - 2R_{xt})P_{xi,t} + (P_{yi,t} - 2R_{yt})P_{yi,t}\}.$$

2. The maximum likelihood decoder according to claim 1, wherein said metric calculating means is constituted by an adder and a bit shifter.

3. A maximum likelihood decoder for dynamically maximum-likelihood-decoding a signal vector sequence control-coded for each symbol to acquire information as it existed before the coding on the signal vector sequence by which noises are reduced, comprising:

branch metric calculating means for receiving said signal vector sequence for each symbol and finding a plurality of branch metrics $\gamma j$ (j is an integer of not less than one nor more than k) with respect to a group of virtual code vectors including a plurality of virtual code vectors; and viterbi decoding means for receiving said branch metrics $\gamma j$ and performing decoding processing using a viterbi algorithm, wherein, assuming said signal vector sequence is represented as a complex number $(R_x, R_y)$, and said group of virtual code vectors is represented as a complex number $\{(P_{xj}, P_{yj})\}_{j=1-k}$, said branch metric calculating means calculating said branch metrics $\gamma j$ in accordance with the following equation:

$$\gamma j = (P_{xj} - 2R_x)P_{xj} + (P_{yj} - 2R_y)P_{yj}.$$

4. The maximum likelihood decoder according to claim 3, wherein said viterbi decoding means comprises adding means for inputting said branch metrics $\gamma j$ and a plurality of path metrics $\lceil p$ (p is an integer of not less than one nor more than m) and adding the branch metrics $\gamma j$ and the path metrics $\lceil p$ in predetermined combinations to output the plurality of path metrics, comparing and selecting means for comparing the path metrics outputted from said adding means in predetermined combinations, selecting the minimum path metric $\lceil p$ in each of the combinations to output the selected minimum path metric, and outputting information indicating which of the path metrics is selected, path metric holding means for holding the path metric $\lceil p$ outputted from said comparing and selecting means and supplying the held path metric to said adding means, a path memory storing the path selection information outputted from said comparing and selecting means, and trace back means for tracing back the path selection information stored in said path memory to output the path selection information traced back as decoding information in accordance with the path metric held in said path metric holding means.

5. The maximum likelihood decoder according to claim 4, wherein said branch metric calculating means is constituted by an adder and a bit shifter.

6. A maximum likelihood decoding method maximum-likelihood-decoding a signal vector sequence control-coded for each block having as one unit n (n is an integer of not less than two) continuous symbol sections to acquire information as it existed before the coding on the signal vector sequence by which noises are reduced, comprising:

a first step of successively receiving the signal vector sequence corresponding to said one block and virtual code vector sequences respectively corresponding to N paths which can exist in the one block and calculating respective metrics of the N paths; and a second step of judging a maximum likelihood path having the minimum metric on the basis of the respective metrics calculated in said first step and outputting, with respect to the virtual code vector sequence corresponding to the maximum likelihood path, information as it existed before the coding on the virtual code vector sequence as the result of the decoding, wherein, assuming said signal vector sequence is represented by $\{R_1, R_2, \ldots, R_t, \ldots, R_n\}$, said i-th (i is an integer of not less than one nor more than N) virtual code vector sequence is represented by $\{P_{i,1}, P_{i,2}, \ldots, P_{i,t}, \ldots, P_{i,n}\}$, and the signal vector $R_t$ and the virtual code vector $P_{i,t}$ in the t-th (where $1 \leq t \leq n$) symbol section are respectively represented as complex numbers by the following equations:

$$R_t = R_{xt} + jR_{yt},$$

and $$P_{i,t} + P_{xi,t} + jP_{yi,t},$$

said first step including calculating a metric $\Gamma i$ of the i-th virtual code vector sequence in accordance with the following equation:

$$\Gamma i = \sum_{t=1}^{n} \{(P_{xi,t} - 2R_{xt})P_{xi,t} + (P_{yi,t} - 2R_{yt})P_{yi,t}\}.$$

7. A maximum likelihood decoding method for dynamically maximum-likelihood-decoding a signal vector sequence control-coded for each symbol to acquire information as it existed before the coding on the signal vector sequence by which noises are reduced, comprising:

a first step of receiving said signal vector sequence for each symbol and finding a plurality of branch metrics $\gamma j$ (j is an integer of not less than one nor more than k) with respect to a group of virtual code vectors including a plurality of virtual code vectors; and a second step of receiving said branch metrics $\gamma j$ and performing decoding processing using a viterbi algorithm, wherein, assuming said signal vector sequence is represented as a complex number $(R_x, R_y)$, and said group of virtual code vectors is represented as a complex number $\{(P_{xj}, P_{yj})\}_{j=1 \sim k}$, said first step [being the step of operating] including calculating said branch metrics $\gamma j$ in accordance with the following equation:

$$\gamma j = (P_{xj} - 2R_x)P_{xj} + (P_{yj} - 2R_y)P_{yj}.$$

* * * * *